United States Patent
Bilgic et al.

(10) Patent No.: US 7,412,010 B2
(45) Date of Patent: Aug. 12, 2008

(54) FREQUENCY CORRECTION IN A MOBILE RADIO RECEIVER USING AN ANALOGUE AND A DIGITAL CONTROL LOOP

(75) Inventors: Attila Bilgic, Kirchheim (DE); Robert Denk, Grafing (DE); Holger Neuhaus, München (DE)

(73) Assignee: Infineon Technologies AG, Munich (DE)

( * ) Notice: Subject to any disclaimer, the term of this patent is extended or adjusted under 35 U.S.C. 154(b) by 734 days.

(21) Appl. No.: 10/811,100

(22) Filed: Mar. 26, 2004

(65) Prior Publication Data
US 2004/0248540 A1    Dec. 9, 2004

(30) Foreign Application Priority Data
Mar. 28, 2003  (DE) ............................. 103 14 149

(51) Int. Cl.
*H03D 3/18* (2006.01)
*H04L 27/06* (2006.01)

(52) U.S. Cl. ........................... 375/327; 375/344
(58) Field of Classification Search .......... 375/326, 375/327, 328, 344; 455/192.1, 192.2, 245.1, 455/255, 257, 260
See application file for complete search history.

(56) References Cited

U.S. PATENT DOCUMENTS

| 6,023,491 A * | 2/2000 | Saka et al. ............... 375/326 |
| 6,571,088 B1 * | 5/2003 | Hasegawa ............ 455/182.2 |
| 2002/0051503 A1 * | 5/2002 | Takahiko .............. 375/327 |
| 2002/0123316 A1 * | 9/2002 | Sih et al. ............ 455/245.1 |
| 2004/0208263 A1 * | 10/2004 | Rives et al. ............. 375/327 |

FOREIGN PATENT DOCUMENTS

| DE | 199 48 899 A1 | 4/2001 |
| DE | 101 22 692 A1 | 11/2002 |
| EP | 1 202 512 A2 | 5/2002 |
| WO | WO 02/060144 A2 | 8/2002 |

* cited by examiner

*Primary Examiner*—Don N Vo
(74) *Attorney, Agent, or Firm*—Eschweiler & Associates, LLC

(57) ABSTRACT

A mobile communication system is provided with a system for frequency correction in a reception apparatus which has a first control system, device or loop for detecting a frequency discrepancy in received signals and for appropriate correction of the frequency supplied to a mixer stage, and a second control system, device or loop for detecting a frequency discrepancy in received signals and for subsequent computerized correction thereof on the basis of the CORDIC algorithm.

13 Claims, 3 Drawing Sheets

US 7,412,010 B2

FREQUENCY CORRECTION IN A MOBILE RADIO RECEIVER USING AN ANALOGUE AND A DIGITAL CONTROL LOOP

REFERENCE TO RELATED APPLICATIONS

This application claims the benefit of the priority date of German application DE 103 14 149.9, filed on Mar. 28, 2003, the contents of which are herein incorporated by reference in their entirety.

FIELD OF THE INVENTION

The present invention relates to a system and a method for frequency correction in a reception apparatus in accordance with the independent patent claims. The invention refers particularly to the frequency correction in a reception apparatus in a mobile station in a mobile communication system.

BACKGROUND OF THE INVENTION

In transmitter/receiver circuits, local oscillators are used to produce a reference frequency. In receiver circuits, this reference frequency can be supplied to a mixer stage in which the received signal is mixed directly or via an intermediate frequency from the carrier frequency to baseband. Any discrepancy between the carrier frequency for the received signal and the receiver's reference frequency supplied to the mixer results in transmission errors in the receiver. Such a discrepancy can be brought about on account of production tolerances, temperature and supply voltage fluctuations in the transmitter and/or receiver and resultant fluctuations in the carrier frequency and/or reference frequency or by the Doppler effect as a result of a relative movement between base station and mobile station.

To counteract transmission errors caused by frequency offset, the transmitter/receiver circuits use, by way of example, expensive, high-quality oscillators which produce a very stable, i.e. fluctuation-free and precise, reference frequency. It is likewise possible to use voltage-fluctuation and temperature-compensated oscillators to reduce the reference frequency's dependency on voltage fluctuations and temperature. In addition, "automatic frequency correction control loops" (AFC loops) are frequently used for precisely setting the local reference frequency. In an AFC control loop, the frequency offset is estimated and the estimate is used to produce a control voltage that is supplied to a voltage-controlled oscillator. The latter's output frequency is used as the input frequency for a PLL control loop. Upstream of the voltage-controlled oscillator, a low-pass filter is used for low-pass filtering of the estimate signal converted into the control voltage. To estimate the frequency offset, a pilot signal having a known content is used in the receiver, for example. If the data rate of the known signal is significantly higher than the possible rate of change of this frequency offset, then it makes sense for the latter not to be corrected until after the estimate has been low-pass filtered. This is frequently indispensable, both in order to improve the quality of the estimates (smaller variance) and in order to prevent unwanted creation of dynamics in the control process, such as oscillation. The low-pass filtering is a crucial drawback for rapid or even abrupt frequency changes.

Such an abrupt change in the apparent frequency of the transmitter occurs, for example in the 3GPP/UMTS/FDD mobile radio system, if the mobile station's reception is changed over from one base station to another base station for particular periods of time. In the "interfrequency compressed mode" operating situation, the original base station's reception is interrupted and is switched to another base station with another carrier frequency for measurement purposes. The switching time provided in the UMTS standard is extremely short in this case.

Although the UMTS standard places an extremely high demand on the base station's carrier frequency precision, apparent discrepancies of several kHz among the base stations may arise, for example on account of Doppler effects. Additional discrepancies may arise on account of switching behaviour and switching delay, as a result of needing to changeover to a different carrier frequency in the receiver. Discrepancies are also possible if the frequency produced in the oscillator or in the downstream PLL control loop for deriving the pattern frequencies differs from the one that is set, and the difference is dependent on the frequency that is set. An example of such a discrepancy would be an unknown nonlinearity in the oscillator's drive characteristic.

A further scenario for wanted rapid changes in the carrier frequency with exact timing is the initial acquisition after turning on the mobile radio. It must be assumed that the oscillator's frequency offset is next to the actual carrier frequency to such an extent that no further signal can be received or found. In this case, a signal search on a plurality of slightly offset frequencies is desirable. In this context, the changeover operation between the individual frequencies should take place as quickly and exactly as possible. Both are impaired by a low-pass filter in the control loop.

Current solutions involve no direct fast correction of the centre frequency in combination with driving the oscillator. By way of example, for the fast change between the base stations in the aforementioned "interfrequency compressed mode" the AFC control algorithm for the oscillator is stopped in the measurement gap for the second base station, and the last value in the control chain is maintained without any subsequent correction at another point. As soon as reception is switched back to the original base station again, the control algorithm is continued at the old point. In this case, losses of reception quality in the measurement gap are therefore accepted.

Another option is simply to allow the AFC control loop to continue. If the control loop's reaction is fast enough to react within the gap, impairment of the reception quality in the transitional ranges is accepted. This is shown in FIG. 1.

Changing over the search frequency for the initial acquisition likewise accepts a longer reaction time for the normal control loop.

SUMMARY OF THE INVENTION

It is thus an object of the present invention to specify a system and a method for frequency correction in a reception apparatus which avoid any impairment of the reception quality even in the event of interruptions in the normal transmission/reception operating state, particularly when changing over a mobile station to a base station operating at a different carrier frequency.

This object is achieved by the features of the independent patent claims. Advantageous developments and refinements are specified in the subclaims.

A fundamental concept of the invention is to provide a system for frequency correction in a reception apparatus that has two independently activatable control devices which can be used to detect and correct a frequency discrepancy, the detection being able to be performed by a device which is used by the two control devices jointly. The system has a detection device for detecting a frequency discrepancy, and a first control device for appropriate correction of the frequency supplied to a mixer stage on the basis of the detected frequency discrepancies. The system also has a second control device for subsequent computerized correction using a suitable algorithm.

Provision can be made for the second control device to have joint use of the means for detecting the frequency discrepancy that are provided in the first control device.

The suitable algorithm used in the second control loop may be the "CORDIC" algorithm, for example.

The first control device can be regarded as an analogue frequency controller that involves active intervention in the received signal's processing process and correction of the mixing frequency used to mix the received radio-frequency signal to baseband on the basis of a detected frequency discrepancy. By contrast, the second control device can be regarded as a digital frequency controller that involves taking a detected frequency discrepancy as a basis for merely passive subsequent, for example CORDIC based, computerized correction of the frequency discrepancy. Frequency correction using the CORDIC algorithm is described in German laid-open specification DE 199 48 899 A1, for example, which is incorporated by reference herein its entirety in the disclosure content of the present application.

A suitable algorithm that may be used for the second control device instead of the CORDIC algorithm is a different algorithm that likewise involves compensating for the frequency discrepancy by means of appropriate counter rotation of the complex received signal.

The inventive system provides the option of activating one or the other of the two frequency control devices or else both frequency control devices in combination on the basis of the situation and mode. In particular, the system may be designed such that only one of the two control devices is active at a time. By way of example, the first control device may be active in the reception apparatus' normal mode, while the second control device is active during predetermined operating states. If the system is used within a mobile station in a mobile communication system, the first control device can be activated during the reception mode with one base station, and the second control device can be activated while the transmission/reception mode is being changed over to another base station.

In line with one embodiment of the inventive system, the first control device can have a PLL control loop that contains a first voltage-controlled oscillator (VCO) whose output frequency is supplied to the mixer stage. In particular, the first control device may in this case have a second voltage-controlled oscillator (VCO), particularly a crystal oscillator, to which a control signal produced on the basis of the detection of the frequency discrepancy is supplied and whose output frequency is the input frequency for the PLL control loop. Upstream of the second voltage-controlled oscillator, a low-pass filter may be used, in particular.

In line with one embodiment of the inventive system, the first control loop may have means for detecting the frequency discrepancy which are part of a RAKE receiver and which produce a frequency discrepancy signal at their output. The first control device may also have means for producing a control voltage to which the frequency discrepancy signal is supplied and which, for their part, supply the control voltage to the second voltage-controlled oscillator.

In line with another embodiment of the inventive system, the second control loop may have a CORDIC computation unit that is contained in the reception path and can be activated and controlled by a control signal. The first control device may be deactivated at the same time as the control signal is output and provided.

The invention also relates to a method for frequency correction in a reception apparatus, in which, in a first operating state, a frequency discrepancy in received signals is detected and a corrected frequency is supplied to a mixer stage, and, in a second operating state, a frequency discrepancy in received signals is detected and subsequent computerized frequency correction is performed on the basis of a suitable algorithm, such as the CORDIC algorithm.

The inventive method may be carried out in a mobile station in a mobile communication system, where the first operating state is represented by the normal transmission/reception mode with one base station, and the second operating state is a state in which the transmission/reception mode is changed over to another base station. In this case, the first operating state may involve the detection of the frequency discrepancy being taken as a basis for producing a frequency discrepancy signal, and a control voltage derived from the frequency discrepancy signal may be supplied to a voltage-controlled oscillator (VCO). The output frequency from the voltage-controlled oscillator is supplied to a PLL control loop, and the latter's output frequency is in turn supplied to the mixer stage. During the second operating state, the output frequency that is output by the voltage-controlled oscillator at the time of the changeover from the first to the second operating state can be maintained. The voltage-controlled oscillator is "frozen" to a certain extent. Hence, although the output frequency which is output by it and supplied to the PLL control loop and the frequency which the PLL control loop supplies to the mixer stage are not correct, this is unimportant, since the frequency correction is performed during the second operating state by the second, for example, CORDIC-based, control device.

BRIEF DESCRIPTION OF THE DRAWINGS

The invention is explained in more detail below with reference to graphs and an embodiment, where.

DETAILED DESCRIPTION OF THE INVENTION

Figure 3:
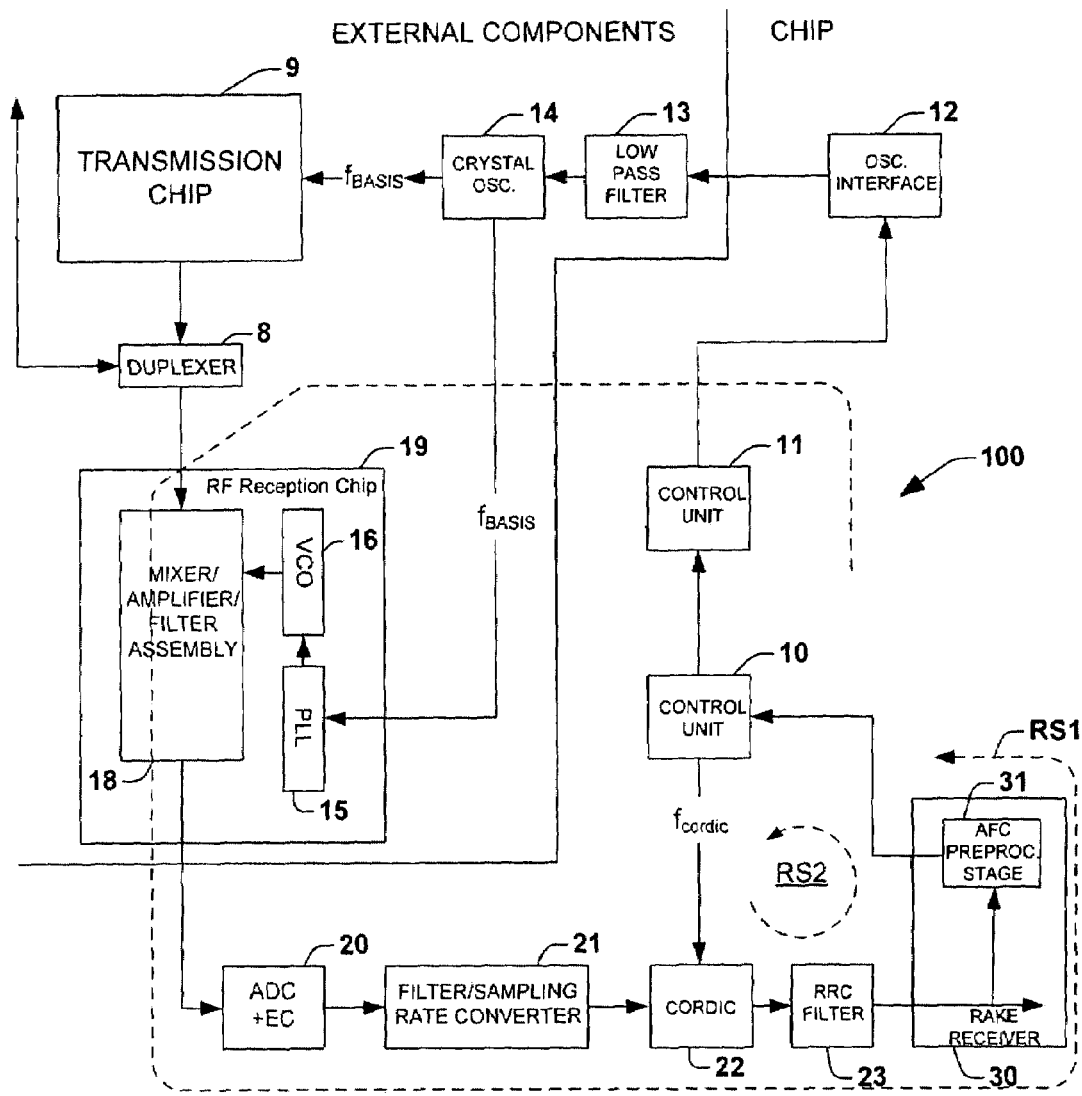
FIG. 3 shows an embodiment of an inventive system for frequency correction.

FIG. 3 shows a system 100 for frequency correction within a reception apparatus in a mobile communication system. This illustration, in one example, shows a received signal processing chip in the bottom right-hand portion and external components in a top left-hand portion. The system 100 comprises both components on the received signal processing chip and external components. However, it should be understood that the present invention extends to integrated frequency corrections systems and are contemplated as falling within the scope of the present invention. The dashed lines identify the control loops RS1 and RS2. The control loop RS1 relates to the active, analogue frequency correction that is used to change the frequency supplied to the mixer stage. The control loop RS2 relates to a digital frequency correction on the basis of the CORDIC algorithm.

A received signal is supplied to the RF reception chip 19 by the duplexer 8. The RF reception chip contains a mixer/amplifier/filter assembly 18 in which the received signal is mixed to baseband, amplified and filtered in a mixer stage. The mixer stage in the assembly 18 is supplied with the frequency as the output frequency from a voltage-controlled oscillator (VCO) 16 associated with a PLL control loop 15. The PLL control loop 15 is supplied with an input frequency $f_{BASIS}$ by a voltage-controlled oscillator (VCO) 14.

The received signal mixed to baseband is supplied to an analogue/digital converter (ADC) 20 by the assembly 18 and is then input into a combined filter/sampling-rate converter assembly 21. This is followed in the reception path by a CORDIC computation unit 22, which can be activated by applying a control signal $f_{cordic}$ to it and is bridged by the reception path in the inactive state. Next, the signals are filtered in a terminating reception filter, for example an RRC (root raised cosine) filter unit 23 used as a pulse shaper, and are input into a RAKE receiver 30 in this state.

Within the RAKE receiver 30, there is an AFC preprocessing stage 31, designed in hardware, which is used to detect a frequency discrepancy in the received signal. This can be done, by way of example, by virtue of a phase difference in signals received at different times being detected, and this phase difference being subsequently used as a control variable, as described in German laid-open specification DE 101 22 692 A1, for example, which is incorporated by reference herein in the disclosure content of the present application.

The AFC preprocessing unit 31 generates a frequency discrepancy signal and supplies it to an AFC control unit 10 designed in firmware. The AFC control unit delivers a control signal to the oscillator control unit 11 designed in software, which outputs a control voltage and supplies it to the crystal oscillator 14 via an oscillator interface 12 and a low-pass filter 13.

The AFC frequency correction that is known per se becomes noticeable in the first control loop RS1. In the AFC preprocessing unit 31, a frequency discrepancy is established and the control units 10 and 11 are used to deliver a control voltage to the crystal oscillator 14, which in turn uses a changed output frequency $f_{BASIS}$ to drive the PLL control loop 15, so that the oscillator 16 drives the mixer stage at a corrected frequency. In the mixer stage, the received signal is mixed to baseband directly or via an intermediate frequency.

In the second control loop RS2, a digital frequency correction is performed on the basis of the CORDIC (coordinate rotation digital computer) algorithm in the CORDIC computation unit 22. The frequency discrepancy signal produced by the AFC preprocessing unit 31 is transmitted to the CORDIC computation unit 22 by the control unit 10 as a control signal $f_{CORDIC}$. The CORDIC computation unit 22 is designed in hardware and has, by way of example, a series circuit comprising a number of microrotation blocks in which a vector having an in-phase component and a quadrature component is respectively rotated through a prescribed angle, as described in the aforementioned German laid-open specification DE 199 48 899 A1, for example. It is therefore clear that CORDIC-based control is based on the start of the reception path being split into an in-phase branch and a quadrature branch.

The inventive system is used in a 3GPP-UMTS-FDD-mobile radio system, for example. In this example, the mobile station changes over to a different base station (BTS) from time to time for measurement purposes. While the mobile station is in the second operating mode, the frequency correction is performed only by the second control loop RS2. The AFC preprocessing unit 31 continues to detect any frequency discrepancies that there may still be and delivers corresponding frequency discrepancy signals to the AFC control unit 10, the frequency discrepancy signals being used by the CORDIC computation unit.

The invention thus achieves the object by means of combined control of the centre frequency. First, the standard control is maintained by the AFC frequency correction using the oscillator 14. The AFC frequency correction corrects the frequency offset under normal conditions and, in the control loop, contains the aforementioned stabilization through low-pass filtering using the low-pass filter 13. Secondly, additional control is provided in the digital front end by driving the CORDIC computation unit 22 formed in hardware. In this way, the centre frequency of the received signal can be shifted by subsequent computational correction without any significant delay and irrespective of the driving of the oscillator 14.

Figure 1:
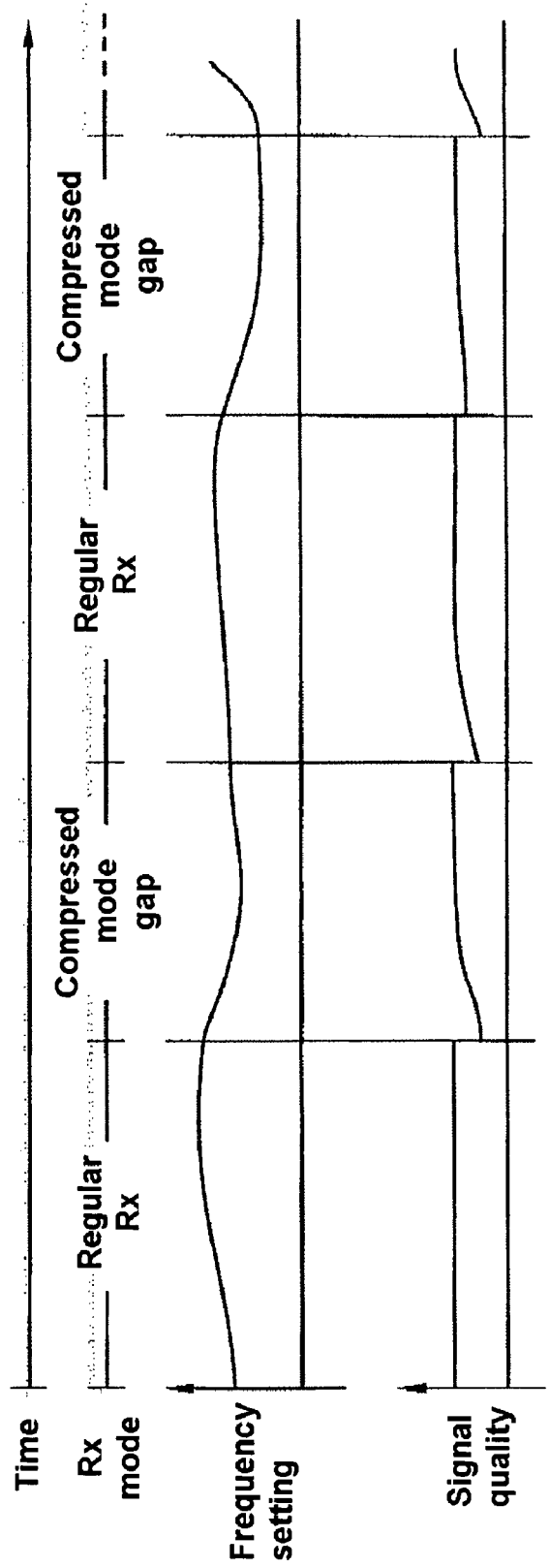
FIG. 1 shows the frequency setting and the signal quality in a conventional frequency-corrected system against time and the operating modes.
Figure 2:
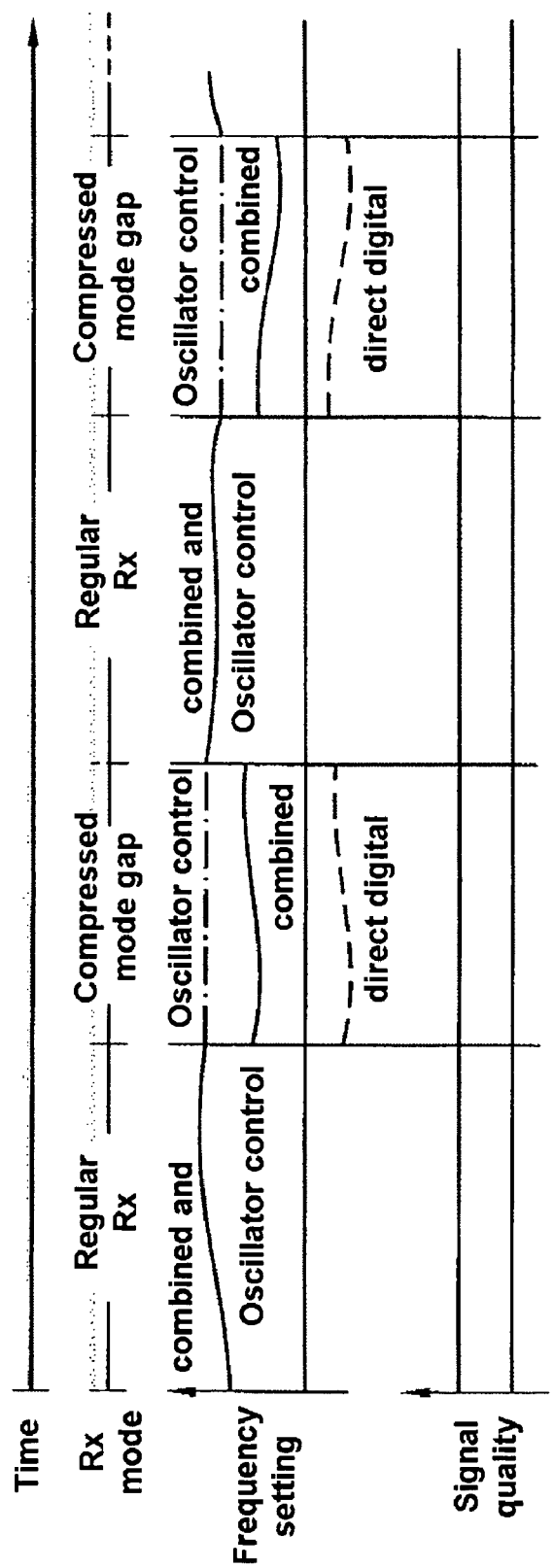
FIG. 2 shows the frequency setting and the signal quality in an inventive system for frequency correction against time and the operating modes.

For the example of the aforementioned "interfrequency compressed mode", the control of the oscillator 14 can be frozen during the compressed mode gap, so that from then on control is affected only by means of the digital control loop RS2. The immediately available shift in the centre frequency may be based simply on measurements from preceding compressed mode gaps. When switching back to the original base station, the digital control loop RS2 is deactivated again and the old centre frequency is immediately available. FIG. 2 indicates how the signal quality can be kept constant through improved frequency correction on the basis of the inventive method.

Provision may likewise be made for the two control loops RS1 and RS2 to operate simultaneously so as to achieve more exact frequency correction in particular situations. However, it is preferable for only the second control loop RS2 to be activated, particularly in the case of frequency corrections that are required at short notice, so as not to impair the oscillator control loop RS1.

The invention claimed is:

1. A system for frequency correction in a reception apparatus, the reception apparatus comprising a mobile station for a mobile communication system, the system comprising:
   a detection device adapted to detect a frequency discrepancy in received signals;
   a first control system configured to correct a frequency supplied to a mixer stage on the basis of the detected frequency discrepancy; and
   a second control system configured to provide digital correction of the detected frequency discrepancy in accordance with an algorithm,
   wherein only one of the two control systems is active at a time, and
   wherein the mobile station is configured such that the first control system is active during a reception mode with one base station, and the second control system is active when a transmission or reception mode is being changed over to another base station.

2. The system of claim 1, wherein the algorithm comprises a CORDIC algorithm.

3. The system of claim 1, wherein the first control system comprises a PLL control loop having a first voltage-controlled oscillator whose output frequency is supplied to the mixer stage.

4. The system of claim 3, wherein the first control system further comprises a second voltage-controlled oscillator to which a control signal produced based on the detection of the frequency discrepancy is supplied and whose output frequency is an input frequency for the PLL control loop.

5. The system of claim 4, wherein the first control system further comprises a low-pass filter upstream of the second voltage-controlled oscillator.

6. The system of claim 1, wherein the first control system comprises means for detecting the frequency discrepancy as part of a RAKE receiver operable to produce a frequency discrepancy signal at its output.

7. The system of claim 6, wherein the first control system comprises means for producing a control voltage to which the frequency discrepancy signal is supplied and supplying the control voltage to the second voltage-controlled oscillator.

8. The system of claim 1, wherein the second control system comprises a CORDIC computation unit within a reception path that is controlled by a control signal.

9. The system of claim 8, wherein the first control system is deactivated at the same time as the control signal is output.

10. A method for frequency correction in a reception apparatus, the reception apparatus comprising a mobile station for a mobile communication system, comprising:

detecting, in a first operating state, a frequency discrepancy in received signals;

supplying, in the first operating state, a corrected frequency to a mixer stage based on the detected discrepancy, wherein the first operating state comprises a normal transmission or reception mode with one base station;

detecting, in a second operating state, a frequency discrepancy in the received signals, wherein the second operating state comprises a state in which the transmission or reception mode is changed over to another base station; and performing, in the second operating state, digital frequency correction based on an algorithm.

11. The method of claim 10, wherein the algorithm comprises a CORDIC algorithm.

12. The method of claim 10, wherein the first operating state involves the detection of the frequency discrepancy being taken as a basis for producing a frequency discrepancy signal, a control voltage derived from the frequency discrepancy signal being supplied to a voltage-controlled oscillator whose output frequency is supplied to a PLL control loop, and the latter's output frequency being supplied to the mixer stage.

13. The method of claim 12, wherein, during the second operating state, the output frequency which is output by the voltage-controlled oscillator at the time of the changeover from the first to the second operating state is maintained.

* * * * *